United States Patent [19]

Ohya et al.

[11] Patent Number: 5,365,140

[45] Date of Patent: Nov. 15, 1994

[54] PIEZOELECTRIC ACTUATOR HAVING STRAIN GAGE

[75] Inventors: Kazumasa Ohya; Kiyotaka Hamada; Takayuki Inoi, all of Tokyo, Japan

[73] Assignee: NEC Corporation, Tokyo, Japan

[21] Appl. No.: 171,668

[22] Filed: Dec. 22, 1993

[30] Foreign Application Priority Data

Dec. 22, 1992 [JP] Japan .................................. 4-341776

[51] Int. Cl.⁵ .............................................. H01L 41/08
[52] U.S. Cl. ..................................................... 310/328
[58] Field of Search ......................................... 310/328

[56] References Cited

U.S. PATENT DOCUMENTS

| | | | |
|---|---|---|---|
| 4,226,507 | 10/1980 | Fuschetto | 350/295 |
| 4,520,679 | 6/1985 | Hatamura | 73/862.04 |
| 4,633,120 | 12/1986 | Sato et al. | 310/328 |
| 4,742,261 | 5/1988 | Rich et al. | 310/328 |
| 4,849,668 | 7/1989 | Crawley et al. | 310/328 |
| 5,059,850 | 10/1991 | Yashimura et al. | 310/328 |
| 5,111,101 | 5/1992 | Imoto | 310/328 |
| 5,126,618 | 6/1992 | Takahashi et al. | 310/346 |
| 5,239,366 | 8/1993 | Kittell et al. | 356/376 |

FOREIGN PATENT DOCUMENTS

| | | | |
|---|---|---|---|
| 0556041 | 8/1993 | European Pat. Off. | G01B 5/00 |
| 137982 | 10/1979 | Germany | G05F 1/00 |
| 63-140661 | 9/1988 | Japan | H01L 41/00 |

OTHER PUBLICATIONS

K. Murakawa et al., "Piezoelectric Actuators", The Sumitomo Search (Japan), No. 47, Oct. 1991, pp. 141–144.

Patent Abstracts of Japan, vol. 12, No. 291 (E-644), Aug. 9, 1988 (JPA-63-066980).

*Primary Examiner*—Steven L. Stephan
*Assistant Examiner*—Thomas M. Dougherty
*Attorney, Agent, or Firm*—Sughrue, Mion, Zinn, Macpeak & Seas

[57] ABSTRACT

Strain gages (81, 82, 83) are adhered to protective layers (31, 32) and an active portion (2) of a laminated-structure (10) of the piezoelectric actuator, respectively. Since it is possible to measure a total amount of displacement of the protective layers (31, 32) and the active portion (2), the measured amount of displacement of the laminated structure (10) is accurate even if there are difference in strain due to temperature and stress between them. The same effect can be obtained for such actuator whose laminated structure (10) further includes any member such as temperature compensating member (19) of metal whose elastic modulus is different from that of the laminated structure.

7 Claims, 5 Drawing Sheets

PIEZOELECTRIC ACTUATOR HAVING STRAIN GAGE

BACKGROUND OF THE INVENTION

The present invention relates to an actuator and, particularly, to a laminated-type piezoelectric actuator having strain gages.

A piezoelectric actuator which utilizes the piezoelectricity of crystal has been used widely in a high precision positioning mechanism since it can control a minute mechanical displacement at high speed. Among others, a laminated-type piezoelectric actuator composed of a laminated structure of piezoelectric films of piezoelectric ceramics, etc., each having thickness of several tens microns and having a thin film internal electrode provided thereon is featured by its capability of generating large force with relatively low drive voltage and has been widely utilized in the fields of high precision positioning control of a semiconductor manufacturing apparatus such as exposure apparatus, control of valves of a mass flowmeter, thickness control in an extruder of plastic film and optical axis control of an optical device, which require high precision control of minute displacement in the order of micron or less.

Since an amount of displacement of such laminated-type piezoelectric actuator depends upon strain generated in the respective piezoelectric ceramics layers correspondingly to a drive voltage applied externally across the respective piezoelectric ceramic layers through external electrodes, it is basically possible to control the amount of displacement of the piezoelectric actuator by controlling magnitude of the drive voltage. In the case of actuator utilizing piezoelectric effect, however, a relation between drive voltage and strain of respective piezoelectric material (ceramic) layers is usually not linear but exhibits hysteresis. Therefore, when the piezoelectric actuator is used in these fields to precisely control displacement in the order of micron or less, it is necessary to detect an actual displacement of the piezoelectric actuator and feed it back to the drive voltage. A construction of such piezoelectric actuator having a strain gage for detecting an amount of displacement of the actuator is disclosed in Japanese Utility Model Laid-open No. Sho 61-140661.

FIG. 1 is a schematic perspective view of a conventional piezoelectric actuator having a strain gage. The piezoelectric actuator itself includes an active portion 2 shown in FIG. 2. Usually, the piezoelectric actuator includes an upper protective layer 31 and a lower protective layer 32 provided on opposite ends of the active portion 2, respectively, as shown in FIG. 2 for reasons of use. In FIG. 2, the active portion 2 is constituted with an alternatively laminated structure of a plurality of piezoelectric ceramics layers 4 and a plurality of internal electrode layers 5. The internal electrode layers 5 are connected to external electrodes 71 and 72 alternatively to form a pair of comb electrodes having electrode fingers arranged interdigitally in cross section, so that the external electrodes 71 and 72 function as opposing electrodes opposing each other through the piezoelectric ceramics layers 4. In FIG. 2, a drive voltage applied between the external electrodes 71 and 72 through leads 711 and 712 is applied between adjacent internal electrode layers 5 to form an electric field across each piezoelectric ceramics layer 4 sandwiched between the internal electrodes. With such electric fields, the respective piezoelectric ceramics layers 4 generate strain in a direction perpendicular to a plane of the piezoelectric ceramics layer, that is, in a thickness direction or laminating direction. The piezoelectric actuator derives the strain as a change of length of the laminated-structure in a thickness direction, that is, a displacement, and transmits it externally.

In the piezoelectric actuator shown in FIG. 1, a strain gage 8 is attached onto a side surface of the actuator on which there is no external electrode is provided. When the drive voltage is applied between the external electrodes 71 and 72, the piezoelectric actuator is extended in the laminating direction thereof by a predetermined amount due to piezoelectric effect. With such expansion of the piezoelectric actuator in the thickness direction thereof, a resistor of the strain gage 8 is subjected to tensile force and its resistance value is increased. An amount of the resistance change is detected through leads 9 and which is linearly related to an amount of expansion or contraction of the piezoelectric actuator, that is, an amount of displacement. Therefore, by preliminarily measuring a relation between the amount of displacement of the piezoelectric actuator and the amount of resistance change of the strain gage at respective drive voltages and detecting the amount of resistance change of the strain gage 8 when a predetermined voltage is applied between the external electrodes 71 and 72, it is possible to know the amount of displacement of the piezoelectric actuator. Further, when the amount of resistance change of the strain gage 8 is inconsistent with an aimed setting value, it is possible to control the amount of resistance change to the aimed displacement by controlling the drive voltage correspondingly to a deviation of the amount of resistance change from the aimed value.

As mentioned above, the amount of expansion or contraction, that is, the amount of displacement, of the laminated-type piezoelectric actuator can be controlled precisely by detecting an actual amount of displacement by means of the strain gage attached to the side surface of the laminated structure and feeding back a difference between the detected displacement and the aimed displacement to the drive voltage.

However, in case where a laminated-type piezoelectric actuator is to be used practically, in addition to the laminated active portion for generating displacement corresponding to the externally applied drive voltage, portions such as protective layers for protecting the active portion and temperature compensating members of metal for improving accuracy of displacement control, which do not produce displacement with the drive voltage, are required in the laminated structure. In such conventional actuator as mentioned above, there may be a difference between a total amount of actual displacement of the whole piezoelectric actuator and an amount of displacement detected by the strain gage, upon which it may become impossible to control displacement precisely. This will be described in detail below.

As mentioned previously, FIG. 2 shows the cross section of the laminated-type piezoelectric actuator having the above-mentioned protective layers. In FIG. 2, the piezoelectric actuator includes a laminated-structure 10 of the active portion 2 and the protective layers 31 and 32 as its basic components.

The active portion 2 is constituted with the alternatively laminated structure of the piezoelectric ceramics layers 4 and the internal electrode layers 5 and displacement thereof is generated in the laminating direction by the drive voltage applied to the external electrodes 71 and 72 and hence to the respective piezoelectric ceramics layers 4 through the respective internal electrodes 5.

The protective layers 31 and 32 are provided to protect the active portion 2 electrically and mechanically against external force. That is, although the basic function of the piezoelectric actuator as an electromechanical transducer is obtained by the active portion 2, it is desirable, in order to use it on a practical device, that an outermost portion of the laminated-structure 10 in the laminating direction is of an insulating material since it can be adapted to an associated device even if the latter is formed of not insulating material but metal material. Further, since each piezoelectric ceramics layer 4 of the active portion 2 is as thin as several tens microns and strength of the electric field generated in the piezoelectric ceramics layer 4 by the drive voltage in the order of 150 V applied thereto is very large, the active portion 2 must be protected mechanically against external mechanical shock in such a way that the piezoelectric ceramics layer or layers 4 are not cracked or damaged. For this purpose, it least the protective layers 31 and 32 are provided on an upper and lower ends of the active portion 2 and, therefore, each protective layer should be thick enough to provide desired protection. For example, the thickness, that is, length in the laminating direction, of each protective layer may be in the order of 2 mm for the active portion 2 having length of 12 mm in the laminating direction. In view of easiness of fabrication of the protective layers 31 and 32, each protective layer is usually formed by laminating thin layers of the same material as that of the piezoelectric ceramics layer 4 constituting the active portion 2.

In the laminated-type piezoelectric actuator constituted as mentioned above, when external force exerted on the laminated structure 10 in the strain generating direction, that is, the laminating direction, is varied, elastic strain of the protective layers 31 and 32 is different from that of the active portion 2 even if they have the same piezoelectric characteristics, since the active portion 2 is subjected to electric field while the protective layers are not. That is, an actual amount of displacement of this laminated structure is a sum of strain of the active portion 2 and strain of the protective layers 31 and 32. In the piezoelectric actuator shown in FIG. 1, however, strain of only the active portion 2 is detected. Therefore, the detected displacement is inconsistent with the actual displacement. Further, since the length of the protective layers 31 and 32 is not negligible with respect to the length of the active portion 2 as mentioned previously, the difference between the actual displacement and the detected displacement is very important.

On the other hand, when temperature of the laminated structure 10 is changed by change of ambient temperature and/or heat generated by an operation of the piezoelectric actuator, detected displacement also becomes inconsistent with actual displacement if coefficient of linear expansion or the active portion 2 is different from that of the protective layers 31 and 32.

It may be considered, in order to flatten temperature characteristics of displacement amount of the piezoelectric actuator, to further provide a temperature compensating member on the upper or lower portion of the laminated structure 10. Such temperature compensating member is a block of such as stainless steel whose coefficient of linear expansion is opposite in sign to that of the laminated-structure 10 formed of piezoelectric material whose coefficient of linear expansion is negative and functions to compensate for variation of displacement of the piezoelectric actuator due to thermal expansion thereof. Length of the temperature compensating member in the laminating direction may be preferably in the order of about 4 mm for the laminated-structure 10 having length of 16 mm. Even in such piezoelectric actuator having such temperature compensating member, a detected displacement also becomes inconsistent with an actual displacement when elastic strain of the active portion 2 is different from that of the protective layers 31 and 32, resulting in degraded accuracy of displacement control.

That is, when a piezoelectric actuator includes, in addition to an active portion which generates displacement corresponding to a drive voltage, portions whose elastic strains and/or strains due to thermal expansion are different each other, preciseness of displacement control according to the conventional technique tends to be degraded when external force in a laminating direction and/or temperature is changed. Such degradation of displacement control accuracy also occurs by change of drive voltage when the active portion is constituted with a plurality of portions made of materials whose piezoelectric properties are different from each other.

SUMMARY OF THE INVENTION

An object of the present invention is to provide a laminated-type piezoelectric actuator having strain gages, with which there is no degradation of accuracy of displacement control even when drive voltage therefor, external force to be exerted thereon and/or temperature thereof is changed.

A piezoelectric actuator according to the present invention which has a laminated structure including an active portion formed by alternatingly laminating a plurality of ceramics layers having piezoelectric characteristics and a plurality of internal electrode layers, for generating strain in a direction perpendicular to the ceramics layers and the internal electrode layers according to a drive voltage externally applied thereto and a plurality of other portions, at least one of strain in the direction caused by drive voltage applied to the laminated-structure, elastic strain in the direction and strain caused by thermal expansion in the direction of adjacent ones of the active portion and the plurality of the other portions being different from each other, is characterized by means fixedly associated with the active portion and the plurality of the other portions, respectively, for detecting strains generated in the direction in the active portion and the plurality of the other portions.

DESCRIPTION OF THE PREFERRED EMBODIMENTS

Figure 2:
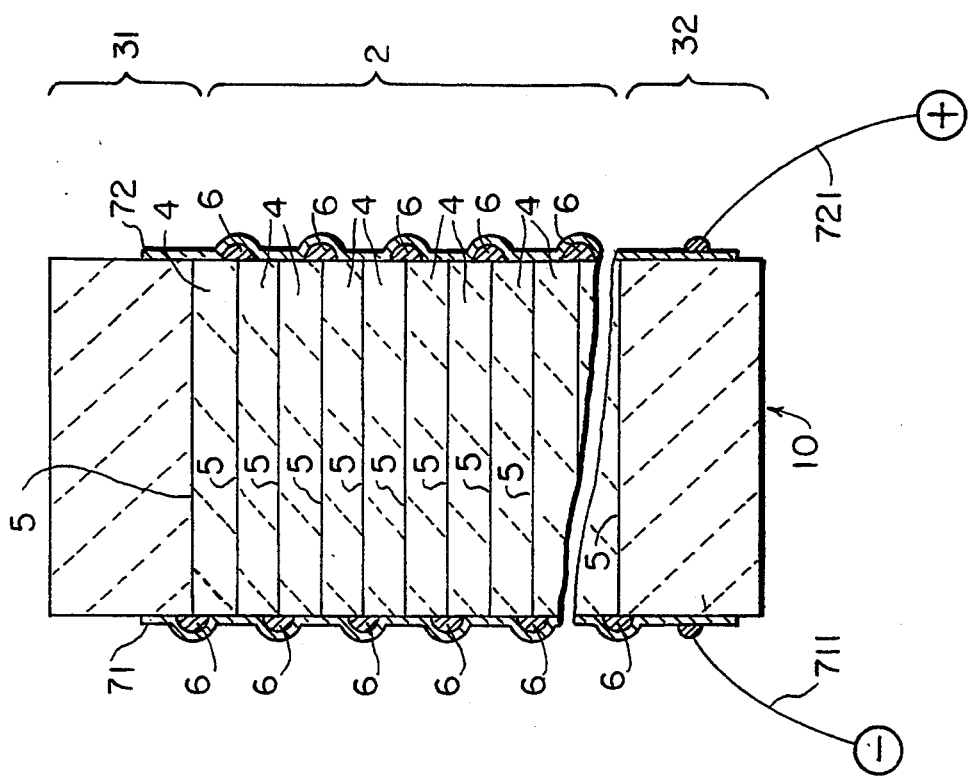
FIG. 2 is a cross section of a laminated structure to be used in the conventional laminated-type piezoelectric actuator.
Figure 1:
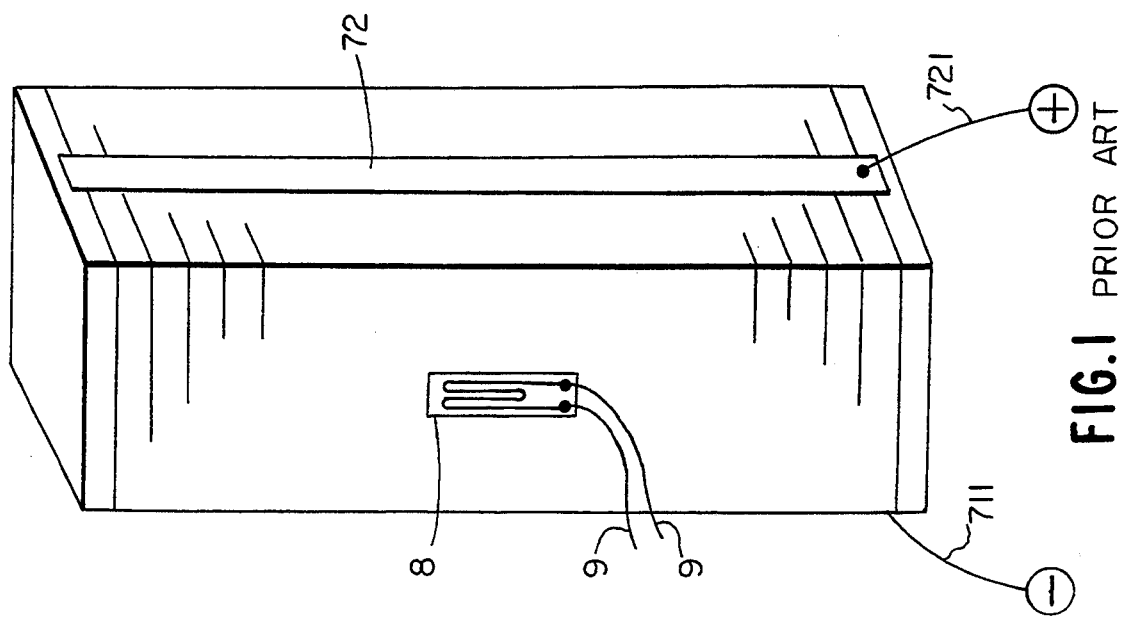
FIG. 1 is a perspective view of an example of a conventional laminated-type piezoelectric actuator having a strain gage.
Figure 3:
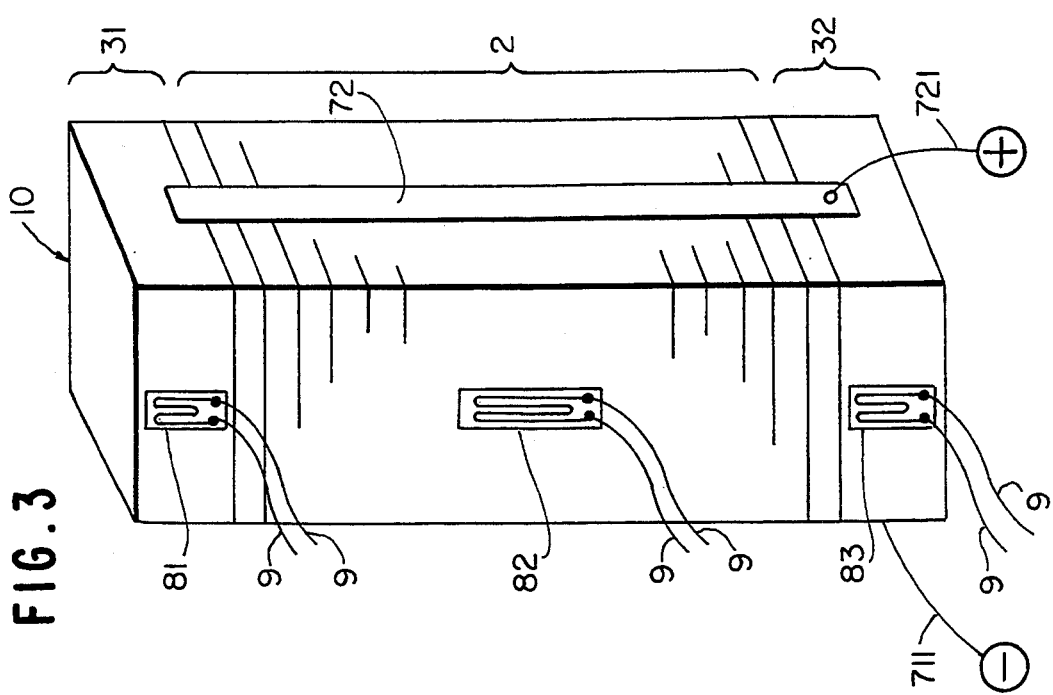
FIG. 3 is a schematic perspective view of a piezoelectric actuator having strain gages according to a first embodiment of the present invention.

Referring to FIG. 3, a laminated-structure 10 has the same structure as that shown in FIG. 2 and is fabricated by a method which will be described with reference to FIG. 2.

First, green ceramics sheets are obtained by slip-casting slurry of a mixture of powder of piezoelectric ceramics such as lead titanate or lead titanate zirconate, a binder and an organic solvent. One surfaces of the green ceramics sheets are screen-printed with a conductive paste containing powder of a mixture of silver and palladium or platinum powder dispersed therein to form internal electrodes. Then, a plurality of the green ceramics sheets having the conductive paste thereon are laminated and green ceramic sheets printed with no conductive paste are disposed on the uppermost and lowermost green ceramics sheets to form a laminated piezoelectric ceramics body. The green ceramics sheets having the internal electrodes printed are adapted to form an active portion 2 and the green ceramics sheets having no internal electrodes are adapted to form an upper and lower protective layers 31 and 32, respectively. After the laminated piezoelectric ceramics body is heated to 100° C. and intimately stacked under pressure, the binder contained therein is decomposed and removed at about 500° C. and, then, sintered at about 1000° C., resulting in a laminated-structure including the protective layers 31 and 32 and the piezoelectric ceramics layers 4 and the internal electrode layers 5 laminated alternatingly with the piezoelectric ceramics layers.

Thereafter, odd numbered internal electrode layers 5 exposed on one side surface of the sintered body are electrically insulated by insulators 6 and even numbered internal electrode layers 5 exposed on the other side surface of the sintered body are electrically insulated similarly such that the internal electrode layers 5 which are not insulated appear alternatingly on the both surfaces of the sintered body. The internal electrode layers 5 which are not insulated and exposed on the both side surfaces of the sintered body are connected electrically to external electrodes 71 and 72, respectively, resulting in a laminated structure 10.

The sintered body of the laminated-structure 10 which includes the piezoelectric ceramics layer 4 having the conductive paste forms an active portion 2 which generates strain due to piezoelectric effect caused by electric field generated by an application of a drive voltage thereto and an upper and lower portions of the laminated structure 10 which include the piezoelectric ceramics layer having no conductive paste form an upper and lower protective layers 31 and 32, respectively, which do not generate strain due to the drive voltage. A cross sectional area of the laminated structure 10 in this embodiment in a direction perpendicular to the laminating direction is 5 mm×5 mm and length thereof in the laminating direction is 16 mm. Length of the active portion 2 is 12 mm and lengths of the protective layers 31 and 32 are 2 mm, respectively.

In the first embodiment shown in FIG. 3, strain gages 81, 82 and 83 each having resistance value of 120 Ω and gage rate of 2 are attached to surfaces of the protective layer 31, the active portion 2 and the protective portion 32, respectively. Gage leads 9 of these strain gages are separately provided. Each of the strain gages used in the first embodiment has a base of polyimide sheet 0.1 mm thick and is adhered to the actuator by an adhesive of epoxy, phenol or cyanoacrylate type under pressure of 2 kgf/cm².

Figure 4:
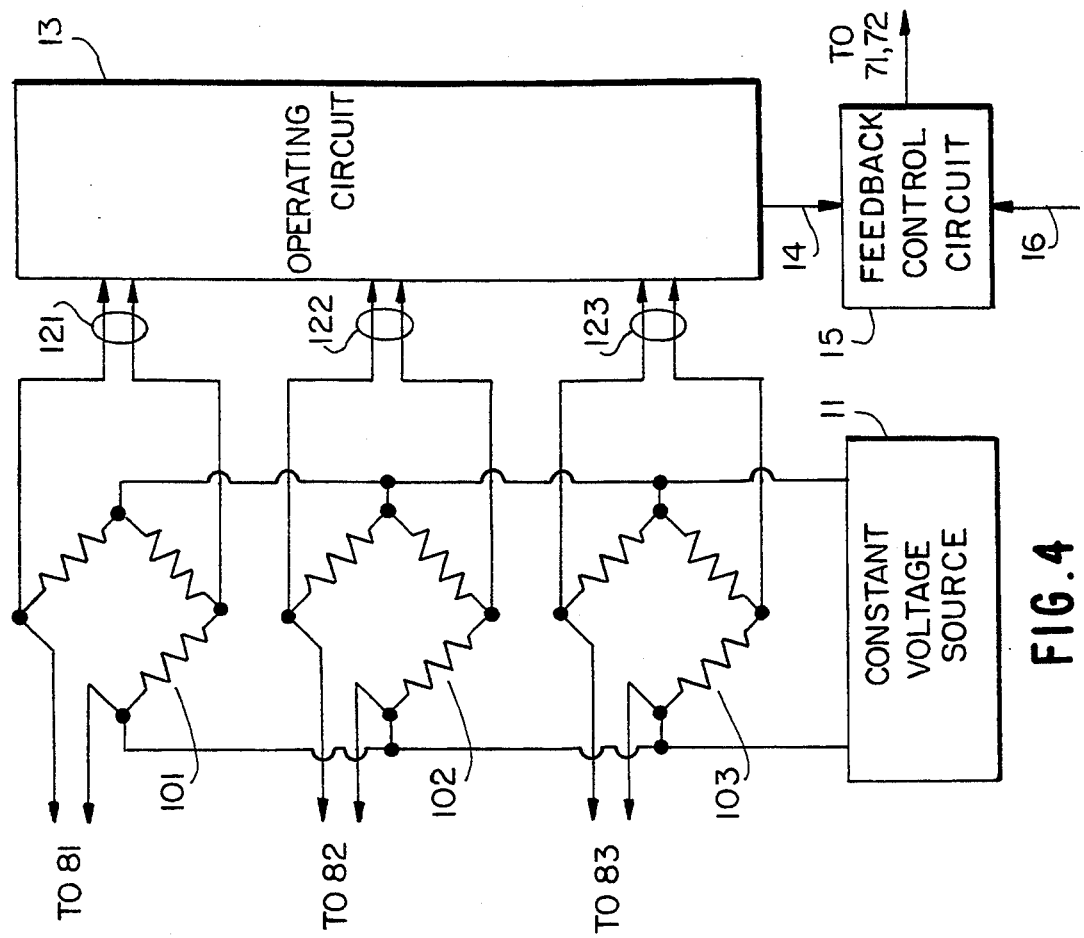
FIG. 4 is a block diagram of a displacement detection and control circuit to be adapted to the first embodiment of the present invention.

Change rates of resistance of these strain gages 81, 82 and 83 are proportional to magnitude of strain in the respective portions (the protective layers 31 and 32 and the active portion 2). In this embodiment, in order to measure such changes of resistances, these strain gages are connected to Wheatstone bridges 101, 102 and 103 each of 120 Ω, respectively, as shown in FIG. 4. The Wheatstone bridges are commonly connected to a constant voltage source 11, from which strain signals 121, 122 and 123 whose magnitudes are proportional to coefficient of strain detected by the strain gages are obtained. The detection of resistance change of the strain gage can be done by any of other known methods than the D.C. bridge method mentioned above.

An amount of displacement of a thing when the latter is deformed is a product of length and strain rate of the thing and a total amount of displacements of a plurality of series-connected things is a sum of displacements of the respective things. Therefore, the total displacement can be obtained by knowing lengths and strain rates of these things.

In this embodiment in which the strain gages 81, 82 and 83 have identical resistance values and identical strain rates and the Wheatstone bridges 101, 102 and 103 connected to the common constant voltage source 11, the magnitudes of the strain signals 121, 122 and 123 are analogous to the strain rates detected by the strain gages 81, 82 and 83, respectively. In this embodiment, the protective layers 31 and 32 and the active portion 2 are 2 mm, 2 mm and 12 mm long in the laminating direction, respectively. Therefore, an operating circuit 13 amplifies the strain signals 121, 122 and 123 with amplification factors equal to ratios of lengths of the portions to which the respective strain gages 81, 82 and 83 are attached and adds them, resulting in a displacement signal 14 proportional to the total displacement of the laminated-structure 10.

In this embodiment, a magnitude y of the displacement signal 14 obtained by the operating circuit 13 is represented by $$y = k \times (2a + 2b + 12c)$$

where a, b and c are magnitudes of the respective strain signals 121, 122 and 123 and k is an arbitrary constant.

By supplying the displacement signal 14 thus obtained to a feedback control circuit 15 having a comparison operation circuit, a displacement corresponding to a control signal 16 assigning an aimed drive voltage value and having no hysteresis can be obtained.

In an example, when the bridge resistances are 120 Ω, respectively, the voltage value of the constant voltage source is 2 V and the voltage values of the respective strain signals are −0.1 V to +0.1 V, a change of 1 mV is obtained. By amplifying the amount of change of 1 mV, the displacement signal 14 of −5 V to +5 V is obtained. By setting the control signal voltage to −5 V to +5 V and comparing it with the displacement signal 14 and amplifying a result of comparison in the feedback control circuit 15, a drive voltage of the piezoelectric actuator in a range from 0 to 100 V is obtained.

Comparing the piezoelectric actuator using the laminated-structure of this embodiment with a conventional piezoelectric actuator using the same laminated-structure as that of the present invention, a deviation of 1 μm or less between the measured displacement and the actual displacement was observed in the present actuator when an external force of 100 kgf is exerted thereon while, in the conventional actuator, it was 5 μm under the same conditions.

Figure 5:
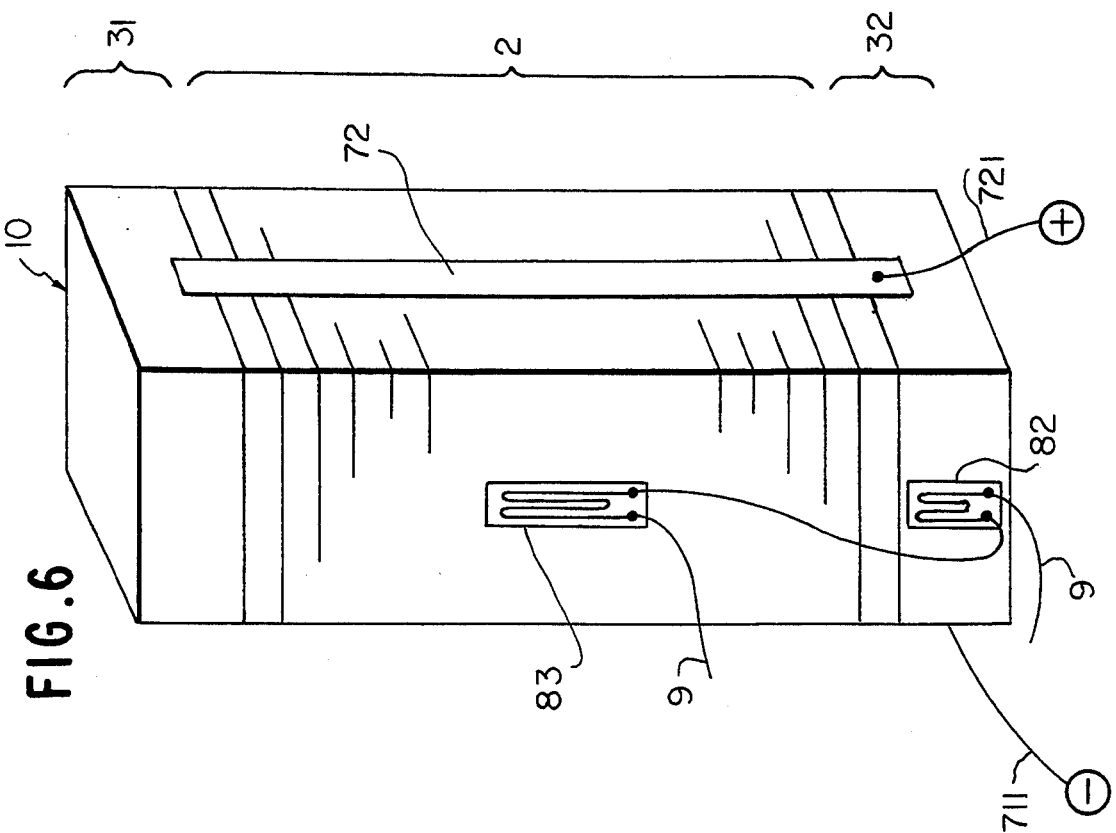
FIG. 5 is a schematic perspective view of a piezoelectric actuator having strain gages according to a second embodiment of the present invention.

The Wheatstone bridges and the operating circuit in this embodiment can be simplified by connecting the three strain gages in series as shown in FIG. 5 which is a perspective view of a second embodiment of the present invention. In FIG. 5, strain gages 81 and 82 are adhered to surfaces of protective layers 31 and 32 of a laminated-structure 10 which is the same as that of the first embodiment and a strain gage 83 is adhered to a surface of an active portion 2 of the laminated-structure 10. Resistance value of the strain gage 83 is 90 Ω and resistance values of the strain gages 81 and 82 are 15 Ω, respectively, and gage rates of the strain gages 81, 82 and 83 are 2 commonly. A series connection of these three strain gages 81, 82 and 83 is equivalent to a single strain gage of 120 Ω. Characteristics of this single strain gage will be described.

Assuming that a strain gage having resistance value R and gage rate K is adhered to a portion of a thing having length L and the resistance R of the strain gage is changed by ΔR as a result of displacement ΔL of the thing deformed at strain rate ε, the following equation is established:

$$\Delta L = L \times \epsilon = L \times (\Delta R/R)/K$$
$$= \Delta R \times \{L/(R \times K)\}$$

Therefore, in such case as this embodiment where the strain gages are adhered to the respective three portions, that is, the protective layers 31 and 32 and the active portion 2, respectively, resistance changes ΔR of the respective strain gages become proportional to displacement ΔL of the respective portions by making a product of the resistance value R and gage rate K of the strain gage proportional to the length L of the thing to which the strain gage is adhered, that is, by making a value of L(R×K) in each portion constant. By connecting these three strain gages in series, displacement of the laminate-structure 10 can be measured by measuring the resistance change of the series connected strain gages. In this embodiment, the strain gages are selected according to this principle.

Although, in the first embodiment, three bridge circuits are necessary for the respective strain gages in addition to the operation circuit for operating the three strain signals, it is enough in the second embodiment to provide the single bridge circuit without requiring any operation circuit.

Figure 6:
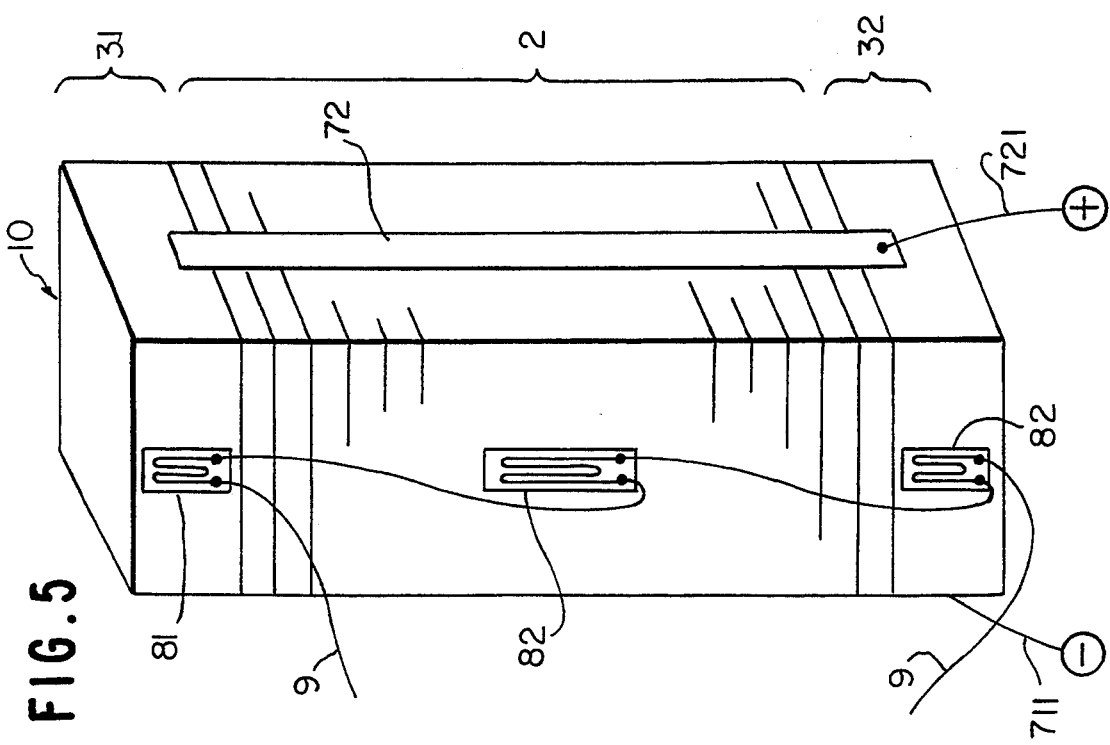
FIG. 6 is a schematic perspective view of a piezoelectric actuator having strain gages according to a third embodiment of the present invention.

FIG. 6 shows a third embodiment of the present invention. In FIG. 6, a laminated-structure 10 is the same as that used in the first embodiment. Since protective layers 31 and 32 are made of the same material and have the same cross sectional areas and the same Young's modulus, strains of them against external force are equal. Further, since thermal expansion coefficients of them are equal, strains thereof against temperature change are also equal. Since, therefore, their strains are always equal, it is possible to remove either one of the strain gages. In order to make resistance change of a single strain gage, in FIG. 6, the strain gage 82, matched with those of the protective layers 31 and 32, the strain gage 82 has a resistance value calculated on the basis of a sum of lengths of the protective layers 31 and 32. In this embodiment, the strain gage 82 is attached to only the protective layer 32. The resistance values of the strain gage 82 and the strain gage 83 are 30 Ω and 90 Ω, respectively, and their gage rates are commonly 2.

Figure 7A:
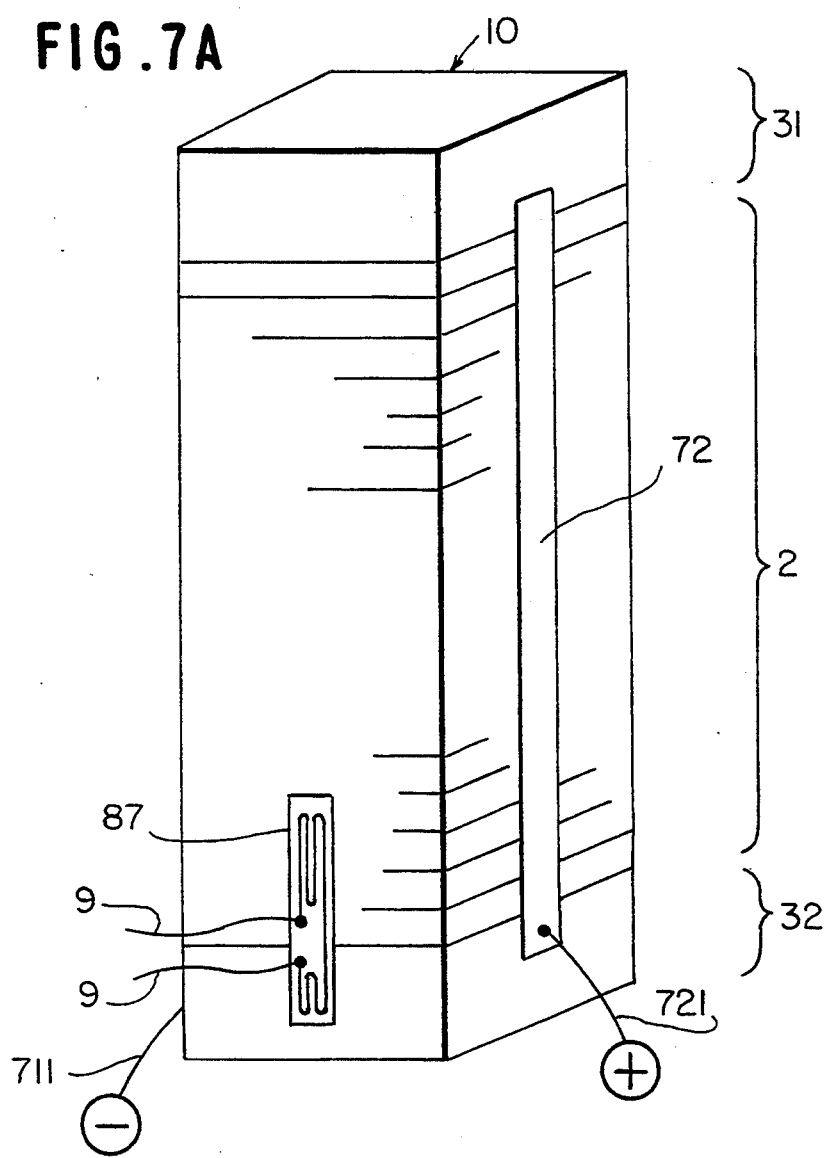
FIG. 7A is a schematic perspective view of a piezoelectric actuator having strain gages according to a fourth embodiment of the present invention.
Figure 7B:
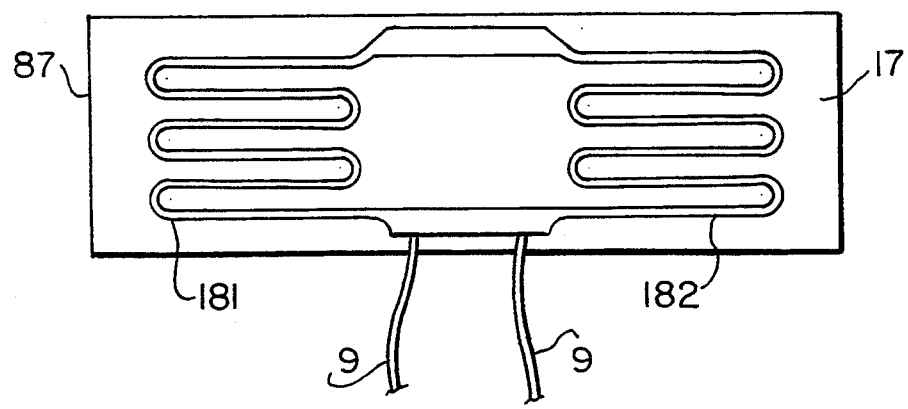
FIG. 7B is an enlarged plan view of a strain gage shown in FIG. 7A.

FIG. 7A shows a fourth embodiment of the present invention. Contrary to the third embodiment in which the strain gages 82 and 83 are attached separately as shown in FIG. 6, a single strain gage 87 formed by series-connecting gage portions 181 and 182 on a common base 17 as shown in FIG. 7B is used in the fourth embodiment to thereby improve the reliability of connection and reduce manufacturing steps. Resistance values of the gage portions 181 and 182 are 30 Ω and 90 Ω, respectively, for a laminated-structure 10 which is the same as that used in the first embodiment and their gage rates are commonly 1.98.

Figure 8:
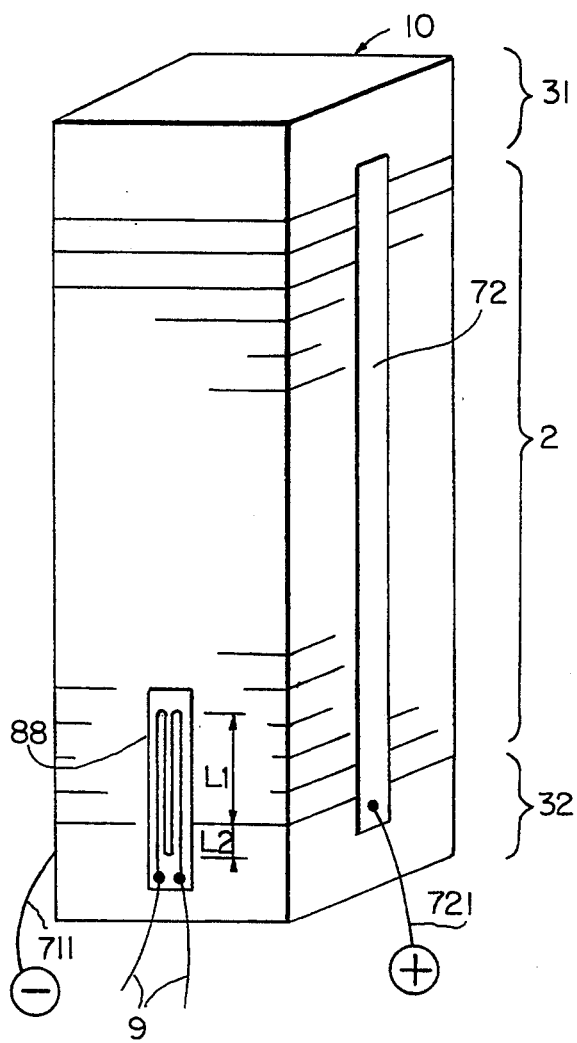
FIG. 8 is a schematic perspective view of a piezoelectric actuator having strain gages according to a fifth embodiment of the present invention.

In a fifth embodiment shown in FIG. 8, a strain gage 88 having resistance value of 120 Ω is attached to a boundary area between an active portion 2 and a protective layer 32 of a laminated-structure 10 which is the same as that used in the first embodiment. The boundary area to which the strain gage 88 is attached covers the protective layer 32 by a distance L1 and the active portion 2 by a distance L2 where L1:L2=3:1. This is equivalent to a case where strain gages having resistance values 30 Ω and 90 Ω, respectively, are connected in series. According to the fifth embodiment, the same effect as that obtained in the third or fourth embodiment can be obtained with a single strain gage having a single gage portion. Further, since identical strain gages have identical gage rates, it is enough to consider only the ratio between L1 and L2.

Figure 9:
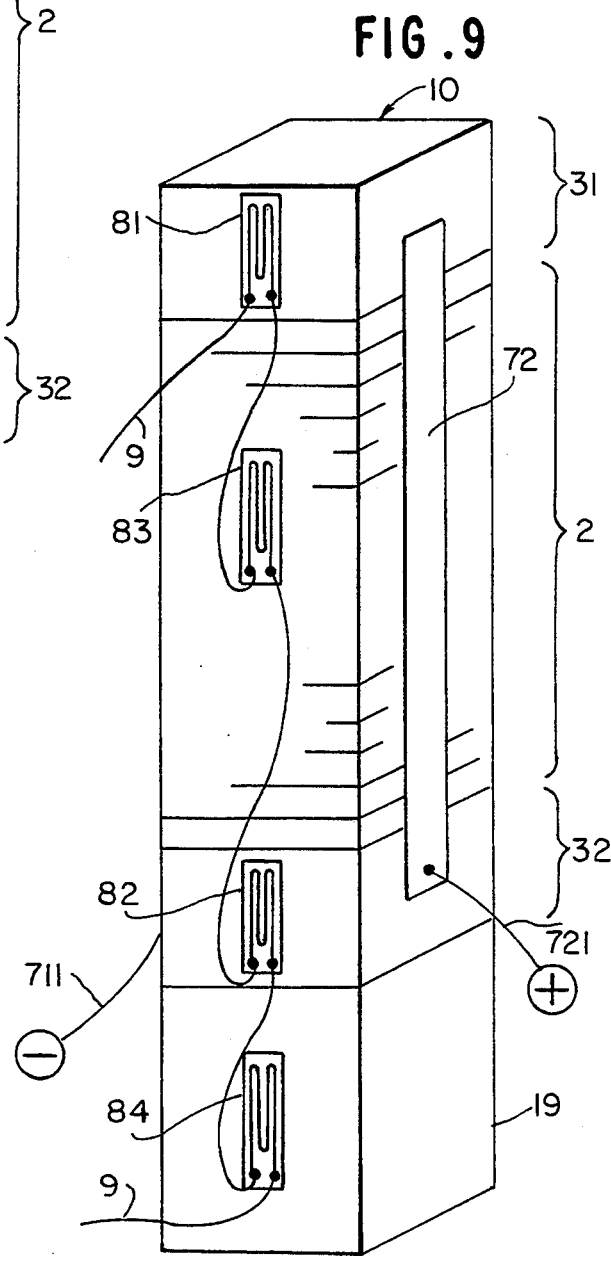
FIG. 9 is a schematic perspective view of a piezoelectric actuator having strain gages according to a sixth embodiment of the present invention.

A sixth embodiment shown in FIG. 9 is constituted by adhering a temperature compensating member 19 formed of stainless steel (15 ppm/°C.) and 4 mm long to the structure of the second embodiment shown in FIG. 5 and adhering a strain gage 84 to the temperature compensating member 19. In this embodiment, since a laminated-structure 10 contracts by 0.06 μm for temperature increase of 1° C., a total thermal expansion thereof as a piezoelectric actuator is substantially zero. By connecting strain gages 81, 82, 83 and 84 having resistance values 72 Ω, 12 Ω, 12 Ω and 24 Ω, respectively, in series, it is possible to correct inconsistency of aimed displacement of the temperature compensating member 19 and the laminated-structure 10 due to difference in elastic strain when external force is changed. That is, in the conventional piezoelectric actuator, it is impossible practically to attach such temperature compensating member for improving its temperature characteristics thereto since strains of the temperature compensating member and the laminated structure become much different from each other when external force is changed. This embodiment exhibits correct displacement for not only temperature change but also change of external force. For example, in the conventional piezoelectric actuator having no temperature compensating member, a controllable range of displacement with respect to an applied voltage is in the order of 3 $\mu$m at 50° C. In this embodiment, however, a controllable range is 0.5 $\mu$m or less at 50° C. and a deviation when external force of 100 kgf is exerted is 1.5 $\mu$m or less.

As described hereinbefore, the piezoelectric actuator according to the present invention is composed of a plurality of portions whose strains caused by drive voltage applied, elastic strains and strains due to thermal expansion are different from each other and strain gages for detecting strains of the respective portions.

Thus, according to the present invention, it is possible to detect strains of the respective portions even when external force is changed and/or temperature is changed, unlike the conventional piezoelectric actuator in which only strain due to drive voltage is detected. Thus, by detecting a displacement of the piezoelectric actuator as a whole on the basis of strains detected in the respective portions and feeding it back to the drive voltage, it is possible to substantially improve the control accuracy of displacement when external force and/or temperature is changed, compared with the conventional piezoelectric actuator. Further, the accuracy of displacement amount can be maintained even in a piezoelectric actuator including a laminated structure composed of a plurality of portions formed of materials having different piezoelectric characteristics.

What is claimed is:

1. A piezoelectric actuator having a laminated structure including an active portion formed by alternatingly laminating a plurality of ceramics layers having piezoelectric characteristics and a plurality of internal electrode layers, for generating strain in a direction perpendicular to said ceramics layers and said internal electrode layers according to a drive voltage externally applied thereto and a plurality of other portions, at least one of strain in said direction caused by said drive voltage applied to said laminated-structure, elastic strain in said direction and strain caused by thermal expansion in said direction of adjacent ones of said active portion and the plurality of said other portions being different from each other, said piezoelectric actuator comprising means fixedly associated with said active portion and the plurality of said other portions, respectively, for detecting strains generated in said direction in said active portion and the plurality of said other portions.

2. The piezoelectric actuator claimed in claim 1, wherein said means includes strain gages associated with said active portion and the plurality of said other portions and wherein a product of resistance value and gage rate of each of said strain gages is proportional to a length in said direction of one of said active portion and the plurality of said other portions, associated therewith and said strain gages are connected in series.

3. The piezoelectric actuator claimed in claim 2, wherein the plurality of said other portions include at least two portions whose strain caused by drive voltage, elastic strain and strain caused by thermal expansion, in said direction, are identical, respectively, and which are not adjacent to each other in said direction and wherein said strain gage fixedly secured to one of said at least two portions has a product of resistance value and gage rate proportional to a sum of lengths in said direction of said at least two portions.

4. The piezoelectric actuator claimed in claim 2, wherein at least two of said strain gages are formed on a common base and wherein said base is fixedly secured to an area containing a boundary between said portions such that said strain gages on said base detect strains of said portions, respectively.

5. The piezoelectric actuator claimed in claim 1, wherein said means includes at least one strain gage associated with adjacent ones of said active portion and the plurality of said other portions for detecting strains of said adjacent portions of said active portion and the plurality of said other portions, said at least one strain gage being fixedly arranged in an area including a boundary between said adjacent portions, a ratio of length of a portion of a gage portion of said at least one strain gage covering one of said adjacent portions to length of another portion of said gage portion of said at least one strain gage covering the other one of said adjacent portions in said direction being equal to a ratio of length of said one of said adjacent portions to length of said the other one of said adjacent portions in said direction.

6. A piezoelectric actuator comprising: an electrostrictive effect element portion having a laminated structure formed by alternatingly laminating a plurality of internal electrode layers and a plurality of piezoelectric ceramics layers, protective members fixedly secured to an upper portion and a lower portion of said electrostrictive effect element portion, respectively, and strain gages fixedly secured to side surfaces of said electrostrictive effect element portion and said protective members, respectively.

7. A piezoelectric actuator comprising: an electrostrictive effect element portion having a laminated structure formed by alternatingly laminating a plurality of internal electrode layers and a plurality of piezoelectric ceramics layers, protective members fixedly secured to an upper surface and a lower surface of said electrostrictive effect element portion perpendicular to a laminating direction thereof, respectively, a first strain gage fixedly secured to a side surface of said electrostrictive effect element portion, a second strain gage fixedly secured to a side surface of at least one of said protective member and means for electrically connecting said first and second strain gages in series, wherein a ratio of a product of resistance value and gage rate of said first strain gage to a product of resistance value and gage rate of said second strain gage is substantially equal to a ratio of length of said side surface of said electrostrictive effect element portion to thickness of said protective member to which said second strain gage is fixedly secured.

* * * * *